(12) United States Patent
Han

(10) Patent No.: US 10,418,393 B2
(45) Date of Patent: Sep. 17, 2019

(54) PHOTODETECTOR

(71) Applicant: VIEWORKS CO., LTD., Anyang-si (KR)

(72) Inventor: Dong Kook Han, Siheung-si (KR)

(73) Assignee: VIEWORKS CO., LTD., Anyang-si (KR)

( * ) Notice: Subject to any disclaimer, the term of this patent is extended or adjusted under 35 U.S.C. 154(b) by 3 days.

(21) Appl. No.: 15/304,190

(22) PCT Filed: Apr. 10, 2015

(86) PCT No.: PCT/KR2015/003588
§ 371 (c)(1),
(2) Date: Oct. 14, 2016

(87) PCT Pub. No.: WO2015/160143
PCT Pub. Date: Oct. 22, 2015

(65) Prior Publication Data
US 2017/0047364 A1    Feb. 16, 2017

(30) Foreign Application Priority Data

Apr. 15, 2014   (KR) ........................ 10-2014-0044572

(51) Int. Cl.
| | |
|---|---|
| H04N 5/3745 | (2011.01) |
| H01L 27/146 | (2006.01) |
| H01L 27/14 | (2006.01) |
| H04N 5/374 | (2011.01) |
| H04N 5/378 | (2011.01) |

(52) U.S. Cl.
CPC ........ H01L 27/14612 (2013.01); H01L 27/14 (2013.01); H01L 27/14638 (2013.01); H01L 27/14643 (2013.01); H04N 5/374 (2013.01); H04N 5/378 (2013.01); H04N 5/37457 (2013.01)

(58) Field of Classification Search
None
See application file for complete search history.

(56) References Cited

U.S. PATENT DOCUMENTS

| | | | |
|---|---|---|---|
| 7,786,543 B2 * | 8/2010 | Hsieh | H01L 27/14634 257/226 |
| 2011/0013060 A1 * | 1/2011 | Sato | H04N 5/23212 348/294 |
| 2013/0214161 A1 * | 8/2013 | Cazaux | H01L 27/14621 250/338.4 |

FOREIGN PATENT DOCUMENTS

| | | |
|---|---|---|
| JP | 2011039124 A | 2/2011 |
| JP | 2011043893 A | 3/2011 |
| KR | 1019980701749 | 6/1997 |

(Continued)

OTHER PUBLICATIONS

International Search Report; PCT/KR2015/003588; International Filing Date: Apr. 10, 2015; 2 pgs.

*Primary Examiner* — Mark T Monk

(57) ABSTRACT

A photodetector is provided, including a plurality of optical signal detection units located at each of multiple pixels and configured to generate electric charges corresponding to light being received, and a switch transistor selectively turned on and off so as to transfer the electric charges generated through the plurality of optical signal detection units at each of the multiple pixels, wherein the plurality of optical signal detection units are connected to each other in series.

2 Claims, 7 Drawing Sheets

(56) References Cited

FOREIGN PATENT DOCUMENTS

KR   10-2007-0050576 A   5/2007
KR   1020110078975       7/2011

\* cited by examiner

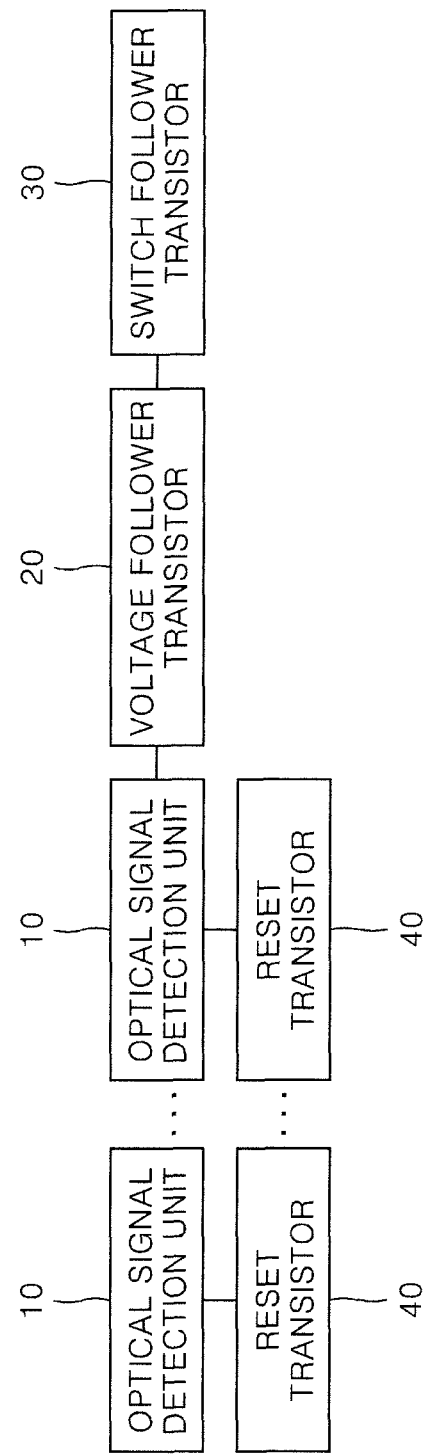

FIG. 3
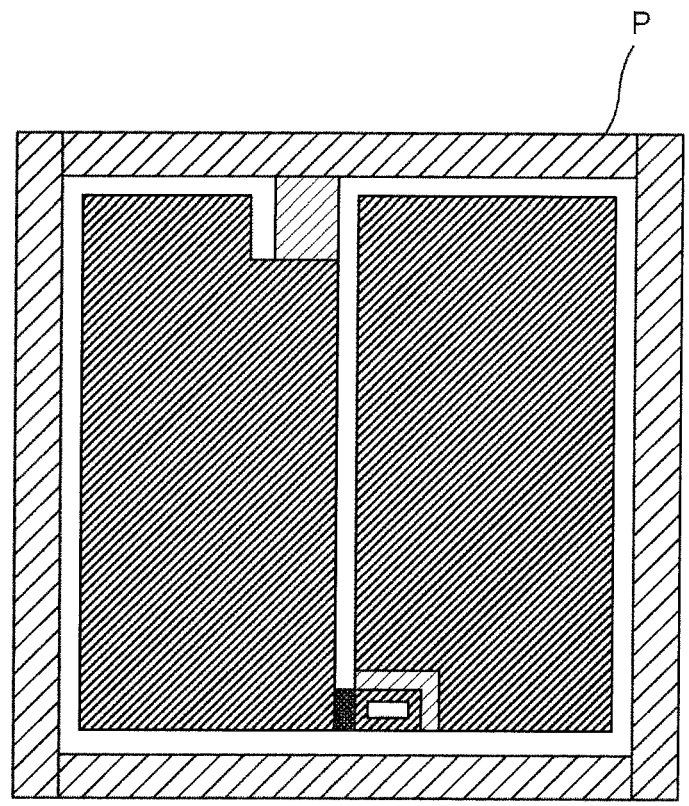
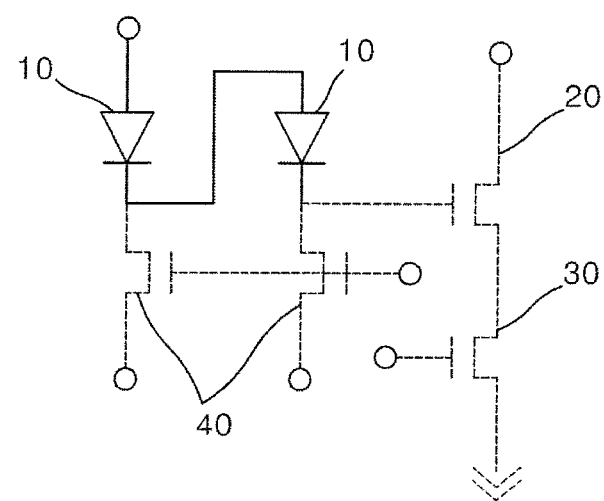

FIG. 4
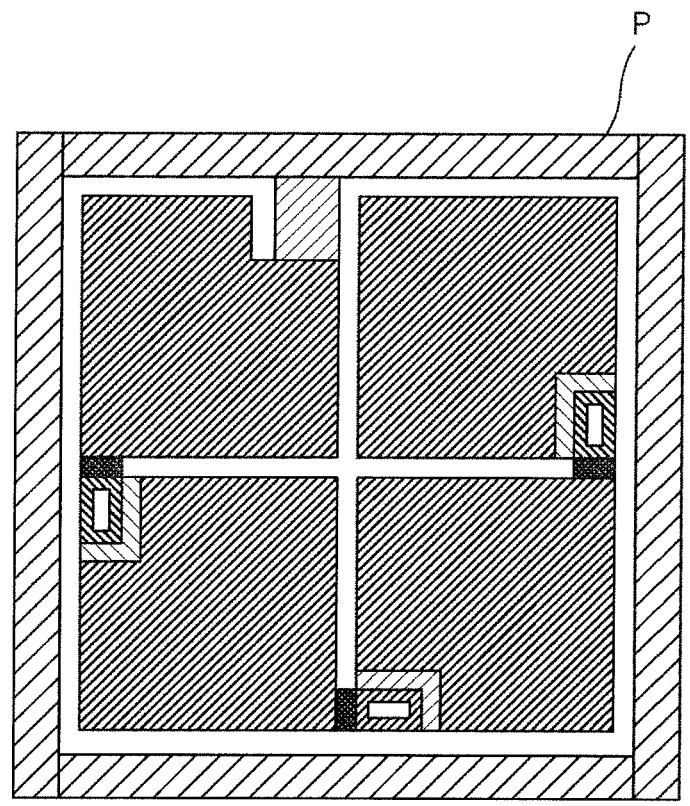
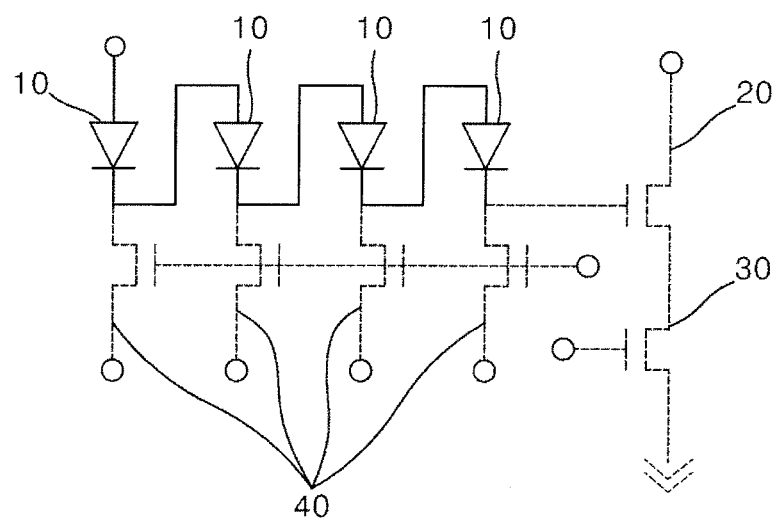

FIG. 5
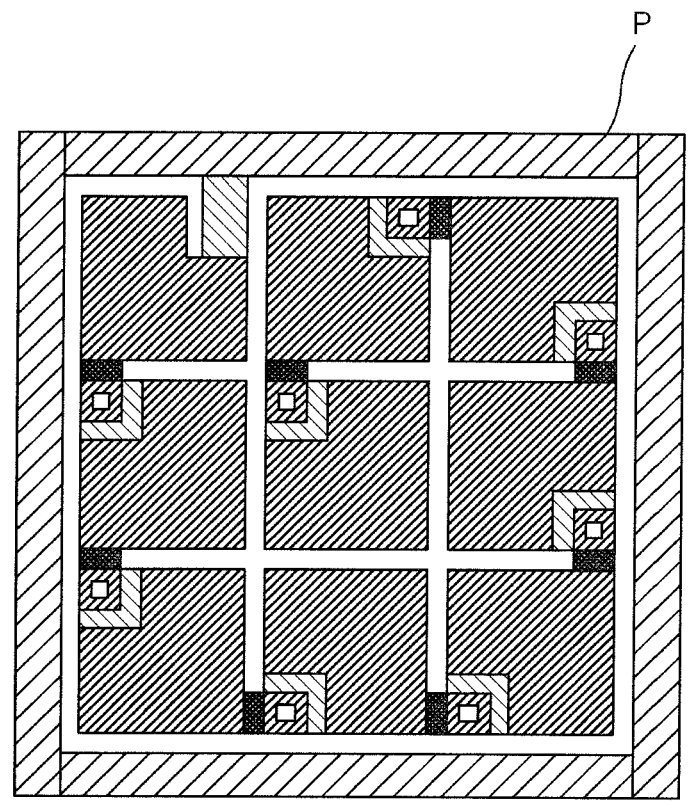
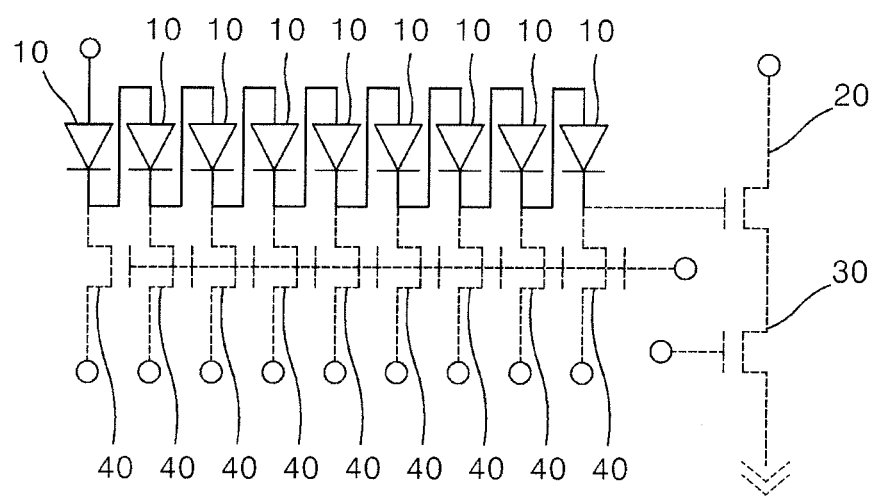

PHOTODETECTOR

CROSS-REFERENCE TO RELATED APPLICATIONS

This application is a continuation application to PCT/KR2015/003588, having a filing date of Apr. 10, 2015, based on KR 10 2014 0044572, having a filing date of Apr. 15, 2014, the entire contents of which are hereby incorporated by reference.

FIELD OF TECHNOLOGY

The following relates to a photodetector, and more particularly, to a photodetector capable of rapidly transferring electric charges detected through an optical signal detection unit and reducing an effect of noise generated while electric charges are transferred.

BACKGROUND

Generally, a photodetector is a device detecting an optical signal to convert into an electrical signal. The photodetector detects an optical signal through a method that generates electric charges according to the optical signal through a device including a photodiode and the like and detects a voltage variation depending on generation of the electric charges, thereby converting into a digital signal.

Specifically, the photodiode is a device detecting light using a PN junction of a semiconductor, and detects light using a phenomenon in which electrons and positive electric charge holes are generated to cause a flow of current when the light is incident on the photodiode.

A PIN diode, an avalanche photodiode (APD) and the like are mainly used as the photodiode, and the PIN photodiode has a structure in which an intrinsic semiconductor layer having large resistance due to fewer carriers is installed in the middle of a PN junction.

On the other hand, the APD includes an avalanche layer in the middle of a PN junction, in which carriers generated according to excitation of incident light collide with atoms in the avalanche layer by a high electric field to newly generate hole-electron pairs.

And the APD uses a principle that an avalanche effect is generated while these hole-electron pairs collide with each other to increase a photocurrent.

Because a bias voltage is required to detect a normal optical signal in such a photodiode, a voltage generator for applying a bias voltage is connected to the photodiode.

The known art related to the present disclosure is disclosed in Korean Patent Application No. 10-2007-0030945 (Publication date: Mar. 16, 2007, entitled of "Optical Detection Device").

DISCLOSURE

Technical Problem

Generally, a photodetector includes a plurality of pixels and selectively receives an optical signal detected by each of the pixels.

At this point, each of the pixels forming the photodetector may be configured with a passive pixel sensor (PPS) transferring electric charges themselves generated in an optical signal detection unit according to an optical signal, or an active pixel sensor (APS) transferring a voltage signal in proportion to electric charges generated in the optical signal detection unit.

FIGS. 1a and 1b are circuit diagrams illustrating a pixel in each of a conventional passive pixel sensor and a conventional active pixel sensor.

With reference to FIGS. 1a and 1b, FIG. 1a shows a passive pixel sensor configured with a single photodiode PD and a single thin film transistor (TFT), whereas FIG. 1b shows an active pixel sensor configured with a single photodiode and three thin film transistors.

By looking at an operation of the passive pixel sensor with reference to FIG. 1a, a photodiode PD generates electric charges in proportion to light when a pixel array is irradiated with the light, and the generated electric charges are transferred to an external charge-voltage converter when a thin film transistor M1 serving as a switch is turned on by an SEL signal.

And, the converted voltage is converted into a digital signal in an analog-to-digital converter (ADC).

By looking at an operation of the active pixel sensor with reference to FIG. 1b, unlike the passive pixel sensor, electric charges generated in the photodiode PD are converted into a voltage due to a capacitance of the photodiode PD itself, and the converted voltage is applied to a second thin film transistor M2.

And, like the passive pixel sensor, a voltage variation in proportion to the generated electric charges is applied to the second thin film transistor M2 when a first thin film transistor M1 is turned on, and in addition, a third thin film transistor M3, which is turned on according to a reset signal RST, may operate to be connected to the photodiode PD to discharge the electric charges thereof.

In an operation performance of the conventional passive pixel sensor or the conventional active pixel sensor, a capacitance of the photodiode PD itself should have a small value so as to transfer electric charges generated in the photodiode PD in a short time.

At this point, a method for lowering a capacitance includes reducing an area of the photodiode PD and thickening an intrinsic (I) layer of the photodiode PD of a PIN type.

However, the reducing of an area of the photodiode PD causes a decrease of a fill factor representing an area of the photodiode PD occupying a single pixel to lower optical charge conversion efficiency.

Also, the thickening of an I layer of the photodiode PD is limited in a manufacturing process, and there is a problem in that a trap generation during a charge transfer is increased as the I layer is thickened, thereby lowering an image quality and optical charge conversion efficiency.

SUMMARY

An aspect relates to a photodetector capable of rapidly transferring electric charges being detected through a plurality of optical signal detection units which are connected to each other in series inside each pixel while maintaining a fill factor, and reducing an effect of noise generated in the course of transferring the electric charges.

Technical Solution

A photodetector according to one aspect of the present disclosure includes a plurality of optical signal detection units located at each of multiple pixels and configured to generate electric charges corresponding to light being received, and a switch transistor selectively turned on and off so as to transfer the electric charges generated through the plurality of optical signal detection units at each of the multiple pixels, wherein the plurality of optical signal detection units are connected to each other in series.

The present disclosure further includes a voltage follower transistor connected between the plurality of optical signal detection units and the switch transistor to output a voltage corresponding to the electric charges generated through the plurality of optical signal detection units.

The present disclosure further includes a reset transistor configured to reset the plurality of optical signal detection units.

In the present disclosure, each of the plurality of optical signal detection units has the same area.

In the present disclosure, the reset transistor is configured in plural numbers so as to reset each of the plurality of optical signal detection units.

Advantageous Effects

According to the present disclosure, by configuring the passive pixel sensor in the form of connecting the plurality of optical signal detection units to each other in series, electric charges being detected may be rapidly transferred while a fill factor with respect to each pixel is maintained.

Also, according to the present disclosure, because an output voltage output from each pixel may be increased two times in the active pixel sensor, an effect of externally induced noise against an output signal may be reduced.

BRIEF DESCRIPTION

Some of the embodiments will be described in detail, with reference to the following figures, wherein like designations denote like members, wherein:

FIG. 2 is a functional block diagram of a photodetector according to one embodiment of the present disclosure;

FIG. 3 is a detailed internal circuit diagram illustrating a single pixel in an active pixel sensor configured to include two optical signal detection units;

FIG. 4 is a detailed internal circuit diagram illustrating a single pixel in an active pixel sensor configured to include four optical signal detection units;

FIG. 5 is a detailed internal circuit diagram illustrating a single pixel in an active pixel sensor configured to include nine optical signal detection units.

DETAILED DESCRIPTION

Figure 1A:
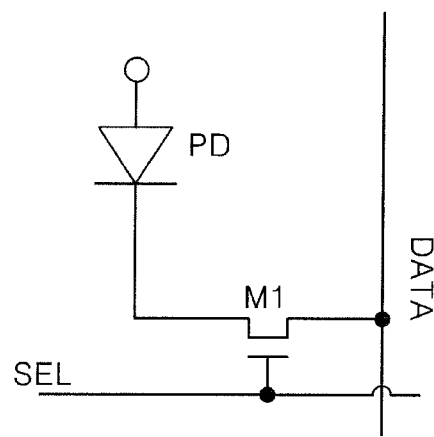
FIGS. 1a and 1b are circuit diagrams illustrating a pixel in each of a conventional passive pixel sensor and a conventional active pixel sensor.
Figure 1B:
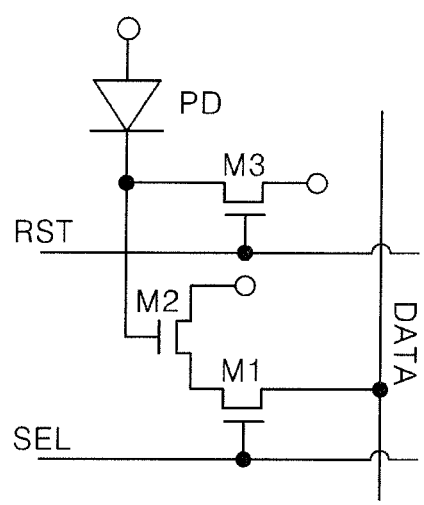

Hereinafter, a photodetector according to one embodiment of the present disclosure will be described in detail with reference to the accompanying drawings. In the course of description, a thickness of a line, a size of a component, and the like which are shown in the drawings may be exaggerated for clarity and convenience of description. Also, all terms used hereinafter are selected by considering a function in an embodiment, and meanings thereof may be different according to the intent of a user and an operator or custom. Therefore, the definitions of these terms used in the following embodiments should be based on the contents disclosed herein.

FIG. 2 is a functional block diagram of a photodetector according to one embodiment of the present disclosure.

With reference to FIG. 2, the photodetector includes a plurality of optical signal detection units 10 and a switch transistor 30.

The optical signal detection unit 10 is located inside each of a plurality of pixels and generates electric charges corresponding to light being received. In particular, the optical signal detection unit 10 receives a bias voltage required for an operation to generate electric charges corresponding to light energy.

Specifically, the optical signal detection unit 10 of the present embodiment includes a photodiode, but is not limited thereto, and it may include any kind of elements capable of using a photo-electric effect generating electric charges when light is applied.

Also, the optical signal detection unit 10 in the present embodiment is configured in plural numbers so as to transfer electric charges being generated in a short time, and the plurality of optical signal detection units 10 are connected to each other in series.

That is, when $\tau$ is defined as a value obtained by multiplying a capacitance $C_{PD}$ of the optical signal detection unit 10 by resistance $R_{ON}$ when the switch transistor 30 is turned on, a time of $5\tau$ is required to transfer 99% or more of electric charges generated through the optical signal detection unit 10.

Therefore, in the present embodiment, the plurality of optical signal detection units 10 are configured to be connected to each other in series so as to reduce capacitances thereof.

Because a magnitude of a capacitance is in proportion to an area of a polarity plate and in reverse proportion to a distance between polarity plates, a capacitance becomes $C_{PD}/2$ corresponding to a half of the existing capacitance when the area of the polarity plate is reduced to a half thereof in a state in which the distance of the polarity plates is identically maintained.

In addition, as described above, because two optical signal detection units 10, each of which has a capacitance reduced to a half of its original capacitance, are connected to each other in series, a synthetic capacitance becomes $C_{PD}/4$ and a time required for transferring 99% of electric charges generated through the optical signal detection unit 10 is $5\tau/4$, so that the electric charges may be transferred about four times faster than a typical photodetector.

As described above, in the present embodiment, because the optical signal detection unit 10 is configured in plural numbers to reduce a capacitance whereas an entire area of the optical signal detection unit 10 configuring a single pixel is identically maintained, an optical signal may be detected without almost any loss of a fill factor.

In other words, a fill factor is a factor that means an effective area sensing light in an area of a pixel so that a sensor of a large fill factor may receive more light in comparison with a sensor of the same area.

Therefore, the photodetector according to the present embodiment does not have almost any loss of a fill factor so that it may maintain sensitivity the same as a conventional sensitivity in response to light being received.

Also, the photodetector according to the present embodiment reduces a capacitance while maintaining the sensitivity the same as the conventional sensitivity so that electric charges being generated may be transferred in a short time.

The switch transistor 30 is selectively turned on and off to transfer electric charges generated through the plurality of optical signal detection units 10.

In other words, because the switch transistor 30 is turned on and off by a signal for selectively receiving electric charges generated in each pixel, a control unit (not shown) of the photodetector turns on a switch transistor 30 of a specific pixel from which the control unit wants to receive electric charges, thereby receiving the electric charges generated through the optical signal detection unit 10 of the specific pixel.

As described above, the photodetector according to the present embodiment is configured to include a passive pixel sensor (PPS) including the plurality of optical signal detection units 10 and the switch transistor 30, thereby enabling to quickly transfer electric charges themselves generated in response to irradiated light.

In addition, the photodetector according to the present embodiment may be configured to include an active pixel sensor (APS) transferring a voltage corresponding to electric charges being generated, and, for this purpose, it may include a voltage follower transistor 20 located between the plurality of optical signal detection units 10 and the switch transistor 30.

The voltage follower transistor 20 transfers a voltage corresponding to electric charges generated through the plurality of optical signal detection units 10.

In other words, the passive pixel sensor is a sensor that detects light in a manner by transferring electric charges themselves generated in proportion to light irradiated to the optical signal detection units 10, thereby sufficing for only an addition of the switch transistor 30, whereas the active pixel sensor is a sensor that detects light in a manner by transferring a voltage in proportion to electric charges being generated, thereby requiring an additional transistor.

In particular, the voltage follower transistor 20 may include a variety of transistors including a bipolar junction transistor (BJT) or a field effect transistor (FET), and the like, and specifically in the present embodiment, it should enable to transfer an input voltage in a state of having almost no effect of impedance to an output end.

Therefore, the voltage follower transistor 20 may be an emitter follower of a bipolar junction transistor, or a source follower of a field effect transistor.

In the present embodiment, a thin film transistor, which is mostly used for an image sensor among field effect transistors, will be described as an example of the voltage follower transistor 20.

At this point, a voltage variation $V_{SIGNAL}$ transferred to the voltage follower transistor 20 is calculated to a value that is obtained by dividing electric charges generated through the optical signal detection unit 10 by a capacitance $C_{PD}$ thereof.

Consequently, when electric charges generated through a single optical signal detection unit 10 forming an area of a single pixel become Q, a voltage variation being output from each pixel of a conventional photodetector has a value of $Q/C_{PD}$.

On the other hand, assuming that the plurality of optical signal detection units 10 according to the present embodiment are 2 in number, and each of the optical signal detection units 10 is formed with an area corresponding to an exact half of an area of a single pixel, electric charges generated through each of the plurality of optical signal detection units 10 become Q/2, and a voltage variation output from each pixel has a value of $(Q/2)/(C_{PD}/2)=Q/C_{PD}$.

And, because the two optical signal detection units 10 are connected to each other in series, a voltage variation $V_{SIGNAL}$ output from a single pixel is $2*Q/C_{PD}$ so that it can be verified that the two times voltage variation is output in comparison with that of the conventional photodetector.

Consequently, a signal-to-noise ratio (SNR) in the photodetector according to the present embodiment may be calculated to $20 \log(V_{SIGNAL}/V_{NOISE})$ so that an increase of a voltage variation may reduce a relative effect of noise.

As described above, when the photodetector according to the present embodiment is configured with the passive pixel sensor, electric charges being detected may be rapidly transferred while a fill factor with respect to each pixel is maintained.

Also, when the photodetector according to the present embodiment is configured with the active pixel sensor, an output voltage being output from each pixel is increased two times so that an effect of noise against an output signal may be reduced.

In addition, the photodetector according to the present embodiment may include a reset transistor 40 for resetting each of the optical signal detection units 10.

As described above, the optical signal detection unit 10 generates electric charges in response to light being irradiated, and an output signal of each pixel is determined according to the electric charges being generated.

And, a photodiode and the like configuring the optical signal detection unit 10 have a characteristic that sensitivity is varied according to an applied bias voltage.

However, because a certain bias voltage, which was applied to the optical signal detection unit 10 before light was irradiated, is varied after the light is irradiated, a reset process for restoring the certain bias voltage to a predetermined value is required so as to maintain a constant condition at every time.

Therefore, in the present embodiment, each of the optical signal detection units 10 is reset through the reset transistor 40 after receiving an output signal from each pixel, thereby eliminating electric charges which exist in each of the optical signal detection units 10 and are generated by a previous optical signal.

Specifically, in the present embodiment, the reset transistor 40 is configured in plural numbers so as to reset each of the optical signal detection units 10.

Here, a number of the reset transistors 40 may be varied depending on whether the photodetector is configured with the passive pixel sensor or the active pixel sensor.

In other words, because a voltage signal corresponding to electrical charges being generated is transferred in the active pixel sensor, the reset transistors 40 with the same number of the optical signal detection units 10 are required to reset each thereof after a signal is transferred.

On the other hand, because electric charges themselves are transferred through the switch transistor 30 in the passive pixel sensor, one among the plurality of optical signal detection units 10, which is directly connected to the switch transistor 30, receives the electric charges and simultaneously is reset.

Consequently, in the passive pixel sensor, the number of the reset transistors 40 fewer by one than the number of the optical signal detection units 10 is required.

Also, when each of the plurality of optical signal detection units 10 has a difference area, a signal magnitude is determined by not only an amount of photons collected based on a single pixel, but a main portion of the single pixel collecting the photons, so that unintended signal distortion occurs.

Consequently, in the present embodiment, each of the plurality of optical signal detection units 10 is formed to have the same area such that signal distortion may be prevented.

Hereinafter, a detailed internal circuit diagram of the photodetector according to the present embodiment will be described. In the present embodiment, an internal circuit diagram configuring a single pixel in an active pixel sensor will be described as an example, and eliminating the voltage follower transistor 20 from the active pixel sensor is sufficient for a passive pixel sensor so that a detailed circuit description thereof will be omitted.

FIG. 3 is a detailed internal circuit diagram illustrating a single pixel in an active pixel sensor configured to include two optical signal detection units.

FIG. 4 is a detailed internal circuit diagram illustrating a single pixel in an active pixel sensor configured to include four optical signal detection units.

FIG. 5 is a detailed internal circuit diagram illustrating a single pixel in an active pixel sensor configured to include nine optical signal detection units.

With reference to FIG. 3, by looking at an operation of a photodetector, a single pixel P is configured with two optical signal detection units 10 having the same area.

In addition, as described above, because the two optical signal detection units 10 are connected to each other in series and the reset transistor 40 is connected to each thereof, electric charges residing in the two optical signal detection units 10 may be reset.

And, a voltage variation according to electric charges generated through the optical signal detection units 10 being connected in series is input to the voltage follower transistor 20, and an output signal from the corresponding pixel P is transferred when the switch transistor 30 is turned on according to a selection of the control unit (not shown) of the photodetector.

Moreover, as shown in FIGS. 4 and 5, the optical signal detection units 10 may be provided in a variety of numbers such as 4 or 9, and each thereof may be preferably formed to have the same area in the single pixel P as described above.

Figure 6:
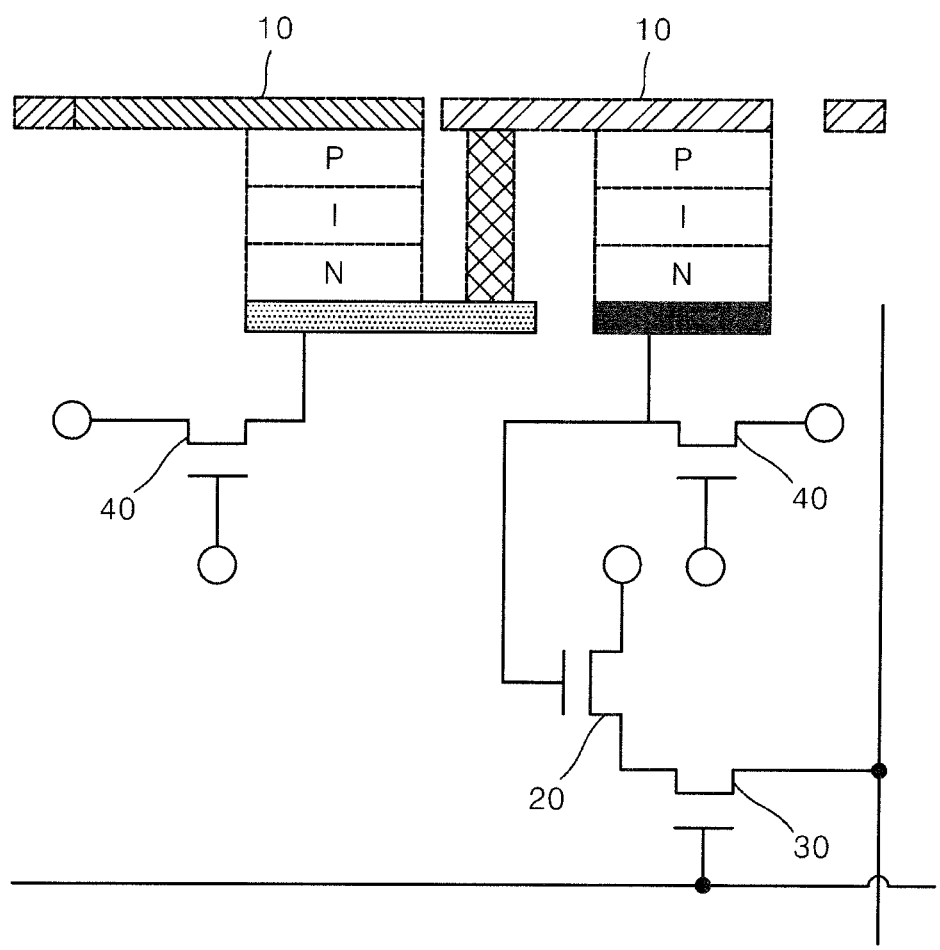
FIG. 6 is a diagram illustrating in detail a connection relationship between a plurality of optical signal detection units configuring a single pixel in an active pixel sensor according to one embodiment of the present disclosure.

FIG. 6 is a diagram illustrating in detail a connection relationship between a plurality of optical signal detection units configuring a single pixel in an active pixel sensor according to one embodiment of the present disclosure.

By looking at a circuit in which a plurality of optical signal detection units are connected to each other in series with reference to FIG. 6, the plurality of optical signal detection units 10 are disposed to be connected to each other in series on a coplanar surface in a manner in which a lower electrode of one optical signal detection unit 10 is connected to an upper electrode of another optical signal detection unit 10 through a via.

And, as described above, it can be verified that the reset transistor 40 is connected to each of the optical signal detection units 10 so as to reset each thereof.

In the example described above, the optical signal detection unit 10 is exemplified by a photodiode and the transistors 20 to 40 are exemplified by a thin film transistor (TFT), but the present embodiment is not limited thereto, and thus they may be altered to a variety of elements capable of performing the functions described above.

Also, a connection relationship between the optical signal detection unit 10 and the transistors 20 to 40 is not limited to FIGS. 3 to 6, and a different connection may be applicable according to a characteristic of the optical signal detection unit 10 or the transistors 20 to 40.

According to the present embodiment, by configuring the passive pixel sensor in the form of connecting the plurality of optical signal detection units to each other in series, electric charges being detected may be rapidly transferred while a fill factor with respect to each pixel is maintained.

Also, in the active pixel sensor, because the present embodiment may increase an output voltage two times output from each pixel, an effect of externally induced noise against an output signal may be reduced.

It should be noted that the term "comprising" does not exclude other elements or steps and the use of articles "a" or "an" does not exclude a plurality. Also elements described in association with different embodiments may be combined. It should also be noted that reference signs in the claims should not be construed as limiting the scope of the claims.

The invention claimed is:

1. A photodetector comprising:
 a plurality of pixels, wherein each of the pixels includes a plurality of optical signal detection units which are configured to generate electric charges corresponding to light being received, and each of the plurality of optical signal detection units has the same area;
 a switch transistor selectively turned on and off so as to transfer the electric charges generated through the plurality of optical signal detection units at each of the plurality of pixels, and
 a voltage follower transistor connected between the plurality of optical signal detection units and the switch transistor to output a voltage corresponding to the electric charges generated through the plurality of optical signal detection units,
 wherein the plurality of optical signal detection units are connected to each other in series on a coplanar surface in a manner in which a lower electrode of one optical signal detection unit is connected to an upper electrode of another optical signal detection unit through a via and are connected to the voltage follower transistor in series.

2. The photodetector of claim 1, further comprising:
 a plurality of reset transistors configured to reset each of the plurality of optical signal detection units.

* * * * *